United States Patent [19]

Vanderheyden et al.

[11] 4,296,390

[45] Oct. 20, 1981

[54] SOLDERLESS FILTER MOUNTING FOR HEADER ASSEMBLIES

[75] Inventors: Eric E. Vanderheyden, Hummelstown; Albert Casciotti, Hershey, both of Pa.

[73] Assignee: AMP Incorporated, Harrisburg, Pa.

[21] Appl. No.: 142,535

[22] Filed: Apr. 21, 1980

[51] Int. Cl.³ .................... H01R 19/06; H01R 19/10; H01R 13/66; H03H 7/01

[52] U.S. Cl. .................................... 333/182; 333/12; 333/183; 333/185; 339/147 R

[58] Field of Search ................................ 333/167-168, 333/181-185, 12; 339/143 R, 147 R, 147 C, 136-138, 278 A; 29/592

[56] References Cited

U.S. PATENT DOCUMENTS

| | | | |
|---|---|---|---|
| 3,539,973 | 11/1970 | Antes et al. | 339/147 R |
| 3,701,285 | 1/1973 | Schor et al. | 333/182 |
| 3,703,701 | 11/1972 | Zimmerman, Jr. | 339/147 R X |
| 3,721,869 | 3/1973 | Paoli | 333/183 |
| 3,743,978 | 7/1973 | Fritz | 333/182 |
| 3,854,107 | 12/1974 | Tuchto et al. | 333/183 |
| 4,178,051 | 12/1979 | Kocher et al. | 339/45 M |
| 4,187,481 | 2/1980 | Boutros | 333/184 X |
| 4,212,510 | 7/1980 | Ritchie et al. | 333/183 X |

*Primary Examiner*—Marvin L. Nussbaum

*Attorney, Agent, or Firm*—Russell J. Egan

[57] ABSTRACT

An improved solderless filter mounting for header assemblies or feedthrough connectors is described for retrofitting filtered terminals into an existing electronic circuit. Each of a plurality of terminals is provided with a filter sleeve which is soldered thereto. The filtered terminal assemblies are inserted into a header housing in a fixed array with the filters being electrically connected to a ground plane by means of a conductive rubber gasket. Rubber mounting blocks are positioned on the filters and pins to each side of the ground plane and the conductive rubber gasket and are placed under compression by housing members to cause an electrical interconnection between the filters and the ground plane through the gasket while absorbing any shock that may be imparted to the filters from the pins. The housing members are identical and are provided with polarizing means, latching means, and the like, as necessary.

11 Claims, 2 Drawing Figures

SOLDERLESS FILTER MOUNTING FOR HEADER ASSEMBLIES

BACKGROUND OF THE INVENTION

1. The Field of the Invention

The present invention relates to a filtered header assembly and in particular to a filtered header assembly or filtered feedthrough connector which obviates the previous requirement for soldering the filters into a metal ground plane.

2. The Prior Art

It is well known in the electronic industry that there are often times when it is essential to provide EMI filtering in electronic circuitry. A line of ferrite-ceramic filters have been developed which accomplish the necessary filtering. An example of such known filters may be found in U.S. Pat. Nos. 3,743,978 and U.S. Pat. No. Re 29,258. These filters are manufactured in the form of a cylindrical sleeve and are secured to a pin type terminal by soldering. It is then necessary to mount the filter pin assembly in some sort of housing device without applying excessive forces to the filter which could easily cause the destruction thereof. An example of known techniques for mounting filters can be found in U.S. Pat. Nos. 3,703,701 and 3,710,285. Basically all the prior attempts for mounting filter sleeves into a ground plane have evolved around forming a stamped metal ground plane and inserting filters into specially formed apertures in the plane. However, this has not always proven to be satisfactory since forces of sufficient magnitude to break and damage the filter sleeve during insertion into the ground plane have often been developed. A more common method of mounting the filters is to solder them into the ground plane. This does not always prove to be too successful in that it is substantially impossible to repair the connector by replacing a filter once it is soldered in place and undesirably high temperatures are often developed during the soldering operations which can effect the dimensional stability of the connector. Conductive rubber sheets have been used in some applications with a metal shelve being used to apply pressure to the conductive rubber to effect an electrical interconnection with the filter. This has generally proved to be costly to assemble and not always provide satisfactory operation since it is still possible for the filters to be dislocated with respect to the ground plane.

SUMMARY OF THE INVENTION

The present filtered header assembly or feedthrough connector is intended to overcome the difficulties of the prior art and provides a pair of identical housing members adapted to be mounted on both sides of a metal ground plane. Each housing member is provided with oppositely directed mating and filter cavities which are interconnected by an array of filter pin passages. Each housing is further provided with means for mounting on a centrally disposed ground plane and can be provided with polarizing means and means for latchingly engaging a mating connector member. The filters are mounted in the respective filtered cavities engaging in rubber mounting blocks. A first rubber mounting block is mounted in one of the filtered cavities and substantially fills the entire cavity. The filtered cavity of the second header has a smaller filter block with a conductive rubber gasket mounted in between the block and the ground plane. Filtered pins are inserted through apertures in the ground plane and passages in the conductive rubber and rubber blocks and passages of the headers. The assembly is then made with the rubber blocks both protecting the filters and applying sufficient pressure to the conductive rubber gasket to make an electrical interconnection between the filter sleeves and the ground plane.

It is therefore an object of the present invention to produce a filtered header or feedthrough connector which does not require soldering of filters into a ground plane.

It is another object of the present invention to produce a filtered header or feedthrough connector which utilizes rubber mounting blocks to effect both a protective mounting of the filters as well as an electrical interconnection with an intermediate ground plane.

It is another object of the present invention to produce a filtered header or feedthrough connector in which rubber blocks or inserts assure good electrical contact between a conductive rubber gasket and a metal ground plane with electrical contact between the outer surface of a filter sleeve and the gasket being primarily due to an interference fit between the filter and an undersized hole in the conductive rubber gasket.

It is a further object of this invention to produce a filtered header or feedthrough connector with mechanically floating and self aligning terminals.

It is a further object of this invention to produce a filtered header or feedthrough connector which readily allows for the intermixing of filter types and sizes within one assembly.

It is a further object of the present invention to produce a filtered header or feedthrough connector with a ground plane system which, due to the sealing characteristics of the conductive rubber gasket, provides for minimal RF radiation leakage, a primary concern in filtered assembly design.

It is a further object of the present invention to produce a filtered header or feedthrough connector which will allow replacement of filter pins with relative ease and without the use of special tools.

It is a further object of this invention to produce a filtered header or feedthrough connector that provides a hermetic seal around each filter element which seal protects both the filter as well as the attendant instrumentation or device from moisture.

It is yet a further object of the present invention to produce a filtered header or feedthrough connector which can be readily and economically manufactured.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
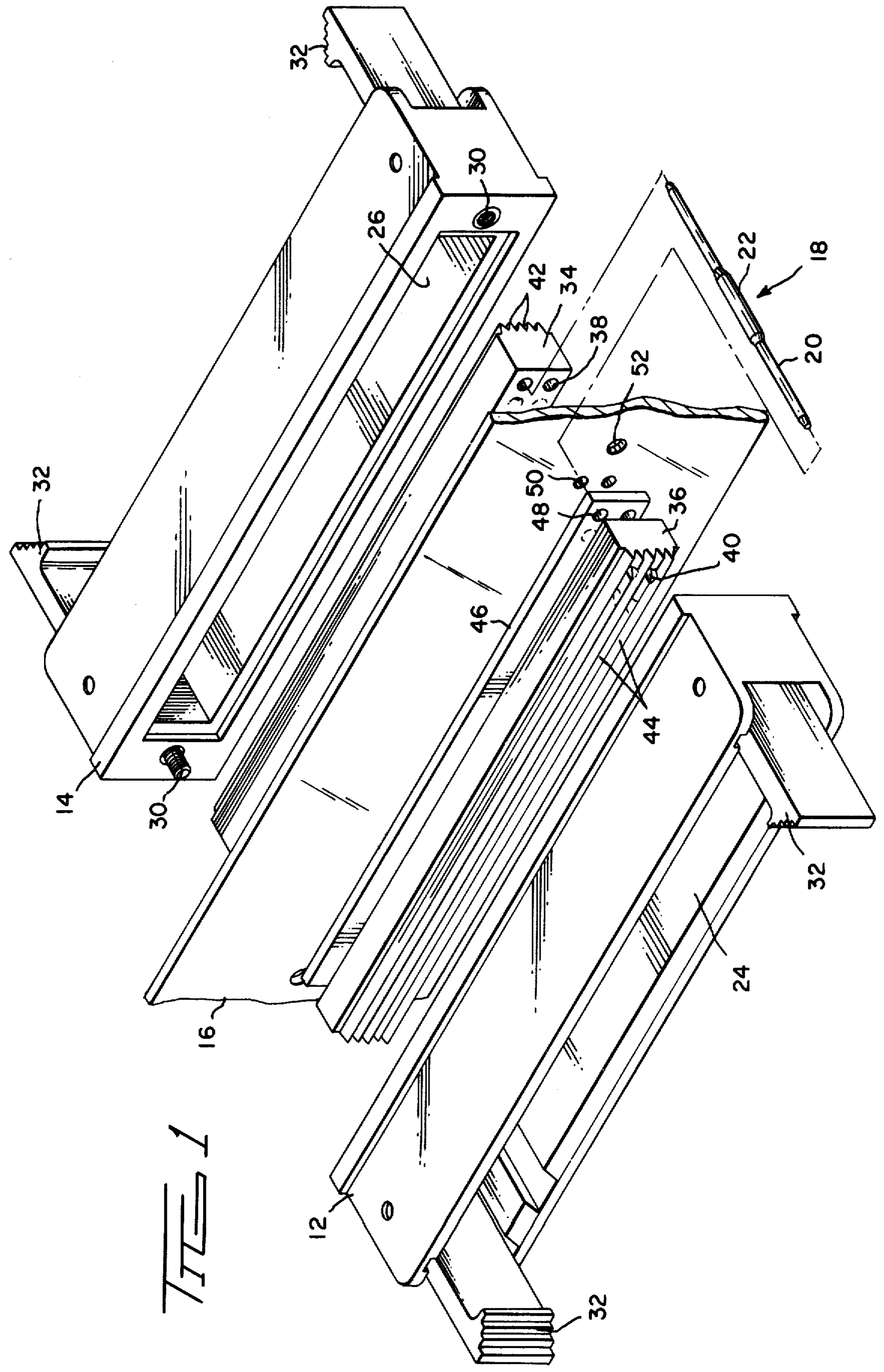
FIG. 1 is an exploded perspective view of a filtered connector according to the present invention.

The subject connector 10 includes a pair of identical housing members 12, 14 which are mounted on opposite sides of a metallic ground plane 16. A plurality of filtered terminals 18, each comprising a pin terminal 20 with a filter sleeve 22 fixedly mounted thereon, are mounted in the ground plane within the housing members 12, 14. Each housing member has a mating cavity 24 and an oppositely directed filter cavity 26 with the cavities being interconnected by an array of apertures 28. Each housing further includes mounting means 30 at each end thereof as well as latching means 32, which, if so desired, can be of the latch-eject variety such as described in U.S. Pat. No. 4,178,051, the disclosure of which is incorporated herein by reference. A first rubber block 34 is positioned in one filter cavity 26 while a second rubber block 36 is mounted in the opposite filter cavity 26. These rubber blocks are substantially the same with the exception of dimensions. Each is provided with a plurality of holes 38, 40 which match the array of the apertures 28. They also have ribs 42, 44 on one surface thereof designed to take up tolerances in all mating parts. A conductive rubber gasket 46 is included with the rubber block 36 and together they have a total thickness equal to the thickness of the rubber block 34. The conductive rubber gasket 46 has an array of apertures 48 which align with the apertures 40 in the rubber block 36. The apertures 48 are undersized with respect to the filter sleeves to cause an interference fit therebetween. The ground plane 16 is provided with a like array of holes 50 which are aligned with the holes in the housings and rubber blocks and mounting holes 52 at the opposite ends thereof.

The subject connector is assembled by first inserting the rubber blocks 34, 36 in the respective filter cavities 26 of the housing members 12, 14. The conductive rubber gasket 46 is placed in one housing member along with the smaller rubber block 36. The filtered pins 18 are applied to the holes 48 of the ground plane 16 and the two housings 12, 14 mated against the respective sides. When the housing members are fully secured to the ground plane, then the rubber blocks 34, 36 are under compression and apply a compressive force against the conductive rubber gasket 46. Thus it will be assured that electrical contact will be made with the ground plane 16. Electrical contact between the filter sleeves and the gasket 46 is caused by the interference fit between the filters and the undersized holes in the gasket.

Figure 2:
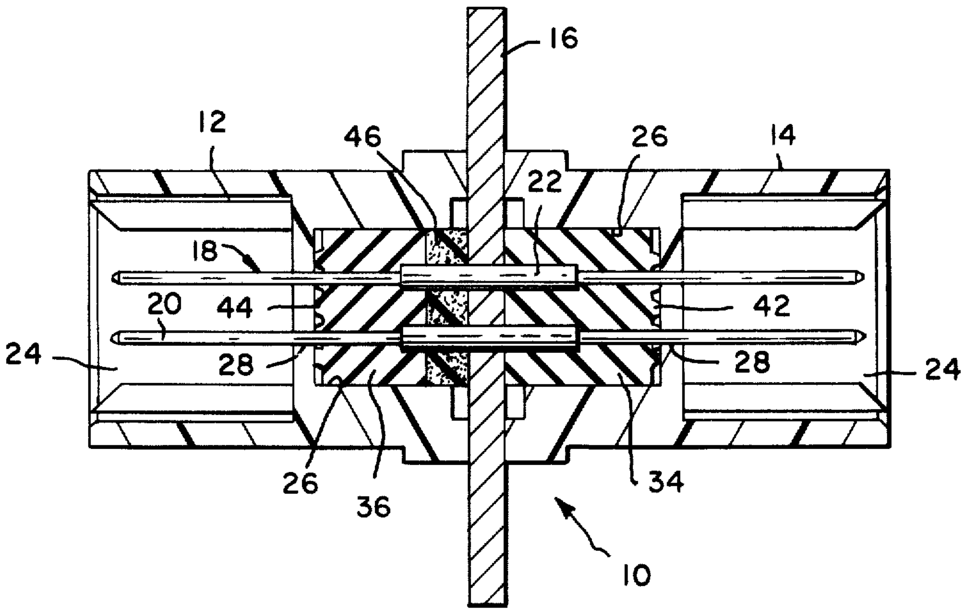
FIG. 2 is a transverse section through the assembled connector of FIG. 1.

It will also be noted from FIG. 2 that the rubber blocks will protect the ends of the filter sleeves and in particular protect the chamfer at each end from damage should the pins be moved axially during mating. To a certain extent the rubber blocks will allow a floating, self aligning action of the terminals.

The mounting of filters in a connector according to the present invention provides the advantage of allowing intermixing of filter types and sizes in a single assembly, the replacement of filters without requiring specialized tools, and excellent sealing resulting in minimal RFI radiation leakage. The rubber blocks could be made of equal size and two gaskets provided. However, this would be a more expensive arrangement.

The present invention may be subject to many modifications and changes without departing from the spirit or essential characteristics thereof. The present embodiment should therefore be considered in all respects as illustrative and not restrictive of the scope of the invention.

What is claimed is:

1. A filtered header or feedthrough connector comprising:

a ground plane;

a pair of hermaphroditic housing members of insulative material each having a planar first mating face and a profiled second mating face, a recess in each said planar face, said recesses together defining a cavity, and a plurality of terminal bores each extending from said second faces to said cavity, said housing members adapted to be mounted by their first mating faces on opposite sides of said ground plane;

a rubber block in each said cavity, each said block having a plurality of apertures therein, each aligned with a respective terminal bore in said housing members;

a conductive rubber gasket in one cavity held in compression between said first mating face and said ground plane and having a like plurality of apertures therein; and a plurality of filtered terminal assemblies each including an elongated terminal with a filter sleeve secured intermediate the ends thereof and received in said blocks with the filter sleeve engaging said conductive gasket and the ends of the terminal projecting from said second mating faces to engage associated terminals, said conductive rubber gasket establishing electrical contact between said filter sleeve and said ground plane.

2. A connector according to claim 1 wherein said second mating face of each said housing member is profiled for mating with a conventional electrical connector.

3. A connector according to claim 1 further comprising means to couple said housing members together with said ground plane therebetween.

4. A connector according to claim 1 further comprising means to mount said connector to a panel in either a forward or back panel condition.

5. A connector according to claim 1 wherein each said rubber block has at least one ribbed surface whereby each filtered terminal has limited mechanical float for self alignment.

6. A connector according to claim 1 wherein each said filter-terminal assembly comprises:

an elongated terminal; and a cylindrical RFI/EMI filter secured intermediate the ends of said terminal.

7. A connector according to claim 6 wherein said filter is a ferrite-ceramic filter.

8. A filtered header or feedthrough connector for retrofitting existing electronic circuitry to provide RFI/EMI filtering, comprising:

a ground plane having a plurality of bores therein;

a pair of mating housing members together defining a cavity therebetween, a plurality of terminal bores extending through said members and entering said cavity in a spaced array;

a plurality of filter-terminal assemblies each including a filter sleeve secured intermediate the ends of an elongated terminal, a mounting system including a rubber block mounted in the cavity portion of each said housing member, a plurality of apertures in each said block each aligned with a respective terminal bore in said array, a conductive rubber gasket mounted between the rubber block of one of said housing members and said ground plane, said gasket having an array of apertures aligned with those of said blocks and said housings and sized to form an interference fit with said filter sleeves, whereby said filter-terminal assemblies are held in said housings with limited float for self alignment and with electrical contact with said ground plane being provided by said gasket.

9. In a filtered header or feedthrough connector means to provide solderless mounting of RFI/EMI filtering, comprising:

a ground plane having a plurality of apertures therein each aligned with a respective terminal of a known electrical connector;

a pair of hermaphroditic housing members each having oppositely directed mating sides, the first of which has an overall profile matable with said known electrical connector and the second of which is substantially planar with a cavity formed therein;

a rubber block mounted in each said cavity;

a conductive rubber gasket mounted between at least one rubber block and said ground plane;

a like plurality of filter sleeves each passing through a respective one of said apertures of said ground plane;

a like plurality of terminals each mounted in a respective one of said filter sleeves, each said terminal having opposite ends projecting from said housing members; and means to mount said housing members so as to apply compression to said blocks.

10. A filtered connector comprising:

a ground plane having an array of apertures therein;

a pair of identical housing members each having oppositely directed mating and filter cavities, a plurality of apertures in a spaced array interconnecting the cavities of each housing member, said housing members being adapted to be mounted on opposite sides of said ground plane with said filter cavities towards said ground plane and said arrays of apertures in alignment;

a first rubber block mounted in the filter cavity of one of said housings and a second similar rubber block received in the filter cavity of the other of said housing members with a conductive rubber gasket interposed between said second rubber block and said ground plane, said blocks and gasket having an array of bores aligned with the apertures in said housing members and said ground plane; and a plurality of filtered terminals, whereby when said housing members are assembled with said ground plane, said rubber blocks and rubber gasket are under compression placing the gasket into electrical contact with said filters and said ground plane.

11. A solderless method for mounting filtered terminals in a connector comprising the steps of:

forming a pair of identical housing members, each with oppositely directed mating and filter cavities, a plurality of apertures in a spaced array interconnecting the cavities of each housing member and means for mounting against opposite sides of a ground plane;

forming a first rubber block to be mounted in the filter cavity of one of said housings and a second similar rubber block to be received in the filter cavity of the other of said housing members with a conductive rubber gasket interposed between said second rubber block and said ground plane, said blocks and said gasket having like arrays of apertures aligned with those of said housing;

forming a plurality of filtered terminals and mounting said filtered terminals in said blocks and gasket and placing said rubber blocks and rubber gaskets under compression so that the gasket makes electrical contact between said filters and said ground plane.

* * * * *